United States Patent
Sachdev et al.

(10) Patent No.: US 7,329,439 B2
(45) Date of Patent: Feb. 12, 2008

(54) UV-CURABLE SOLVENT FREE COMPOSITIONS AND USE THEREOF IN CERAMIC CHIP DEFECT REPAIR

(75) Inventors: Krishna G. Sachdev, Hopewell Junction, NY (US); Daniel G. Berger, New Paltz, NY (US); Kelly M. Chioujones, San Diego, CA (US); Brian W. Quinlan, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 228 days.

(21) Appl. No.: 10/953,752

(22) Filed: Sep. 29, 2004

(65) Prior Publication Data

US 2006/0069177 A1    Mar. 30, 2006

(51) Int. Cl.
  *C08J 3/28*   (2006.01)
  *C09D 3/34*   (2006.01)
  *C08K 3/34*   (2006.01)
  *C08K 13/02*  (2006.01)

(52) U.S. Cl. ............. 427/517; 522/83; 522/71; 522/49; 522/42; 522/46; 522/47; 522/68; 522/33; 522/109; 522/40; 427/519; 524/443; 524/445; 524/451

(58) Field of Classification Search ............ 522/83, 522/71, 109, 110, 40, 42, 46, 47, 68, 33; 427/517, 519; 524/443, 445, 4
See application file for complete search history.

(56) References Cited

U.S. PATENT DOCUMENTS

| | | | |
|---|---|---|---|
| 4,533,445 A | 8/1985 | Orio | |
| 4,544,623 A | 10/1985 | Audykowski et al. | |
| 4,902,578 A | 2/1990 | Kerr, III | |
| 6,682,872 B2 | 1/2004 | Sachdev et al. | |
| 6,852,768 B2 * | 2/2005 | Jin et al. | 522/79 |
| 7,071,259 B2 * | 7/2006 | Botros | 524/504 |
| 7,084,197 B2 * | 8/2006 | Chin et al. | 524/99 |
| 7,230,047 B2 * | 6/2007 | Issari | 524/500 |
| 2004/0122153 A1 * | 6/2004 | Guo et al. | 524/430 |
| 2004/0147639 A1 * | 7/2004 | Tsou et al. | 523/216 |
| 2005/0143508 A1 * | 6/2005 | Tyagi et al. | 524/423 |
| 2005/0203202 A1 * | 9/2005 | Ramsey | 522/71 |
| 2006/0128866 A1 * | 6/2006 | Diakoumakos et al. | 524/445 |

* cited by examiner

*Primary Examiner*—Susan W Berman
(74) *Attorney, Agent, or Firm*—DeLio & Peterson, LLC; John J. Tomaszewski; Ira D. Blecker

(57) ABSTRACT

Solvent-free UV-curable polymer materials derived from miscible blends of reactive organic monomeric, oligomeric and low molecular polymeric systems and organic and inorganic fillers such as polytetrafluoroethylene and talc are provided to form polymer-filler composite compositions for use in the fabrication and repair of electronic components and microelectronic assembly processes. The composition contains a preformed thermoplastic or elastomeric polymer/oligomer with reactive end groups, a monofunctional and/or bifunctional acrylate monomer, a multifunctional (more than two reactive groups) acrylated/methacrylated monomer, a photoinitiator and a fluorocarbon polymer powder as an organic filler which is preferably PTFE and an inorganic filler such as talc. A nano-filler may also be used as the inorganic filler alone or in combination with another inorganic filler such as talc. A method is also provided for repairing defects on ceramic substrates using the composition of the invention or other curable polymeric compositions.

17 Claims, No Drawings

UV-CURABLE SOLVENT FREE COMPOSITIONS AND USE THEREOF IN CERAMIC CHIP DEFECT REPAIR

FIELD OF THE INVENTION

This invention relates to solvent-free uv-curable polymer materials derived from a miscible blend of reactive organic monomeric, oligomeric, and low molecular polymeric systems in which organic fillers and inorganic fillers, preferably surface modified inorganic fillers, are dispersed to form polymer-filler composite compositions for use in the fabrication and repair of electronic components and microelectronic assembly processes. In particular, this invention is concerned with improved uv-curable formulations and an improved method of use of the improved uv-curable formulations and other uv-curable formulations for repairing ceramic chip defects in the peripheral sealing region of ceramic modules to enhance manufacturing product yield loss recovery and to provide performance reliability of module assembly product.

BACKGROUND OF THE INVENTION

In the fabrication of high performance glass ceramic chip carriers with copper based internal wiring in the fabrication of high circuit density electronic modules, it is generally observed that there is higher incidence of ceramic chipping and surface imperfections occurring in the manufacturing operations and testing procedures which is caused by the inherent fragility and lower strength of glass ceramic-copper than alumina ceramic-molybdenum based substrates. When such defects appear in the seal band perimeter region designed for protective cap attachment in the case of non-hermetic modules or in the flange area in the case of the hermetic modules and when the defect dimensions do not meet the acceptance specification criteria, the product is rejected at the final inspection. For the seal integrity in the top surface protective cap attachment, it is critical that the top surface metal (TSM) flange or seal band area be free of such defects in order to assure that in the module assembly, the silicon devices remain protected from any detrimental effect of environmental exposure during the long-term functional performance of the electronic device. Any defects or imperfections at the seal band area can interfere with the sealing process causing problem with seal integrity and long term functional reliability.

Considering the generally observed product yield loss due to seal region chipped ceramic in manufacturing adding to the overall product cost and the assembled product reliability issues, it is highly desirable to have a uv-curable composition and a ceramic chip repair method that is practical, efficient, low cost, reliable, and extendable to various ceramic chip carriers so as to recover/reclaim high performance glass ceramic products. Various requirements for the material composition and the defect repair method include good adhesion to ceramic; good flow properties suitable for chip fill without introducing voids; low shrinkage upon cure; high thermal stability of the cured polymer deposit filling the chipped ceramic area such that it is compatible with bond and assembly processing which includes solder flux exposure; high temperature chip join solder reflow requiring 350-365° C. peak temperature for 97/3 lead/tin alloy (97% Pb/3% Sn) solder bumps; flux residue cleaning process; good mechanical properties, and the defect repaired region having no detrimental effect on the seal integrity. It is also desirable that the uv-cured polymer materials used for repair have compatibility with lead-free solder joining processes for silicon devices to chip carriers. Other requirements for the material in defect repair processes is the ability to fill defects 2-30 mils deep in a ceramic chip, preferably 5-20 mils deep, without drooping during filling or introducing voids or blistering when it is subjected to uv curing followed by thermal bake.

A number of uv curable compositions for use as protective coatings and PCB solder mask in low temperature soldering processes for component attachment have been described in the literature and many such uv curable materials are commercially available. In the solder mask application, for example, the solder mask composition covers the selected areas of the printed wiring board (PWB) circuitry allowing selective soldering of the areas which are covered by the solder mask and thus prevents solder bridges during component soldering process. The solder mask is typically kept permanently in place to provide long term insulation and protection against mechanical and environmental damage.

U.S. Pat. No. 4,533,445 (Orio et al.) describes a uv-curable composition with good adhesion to copper and Pb—Sn solder, comprising an epoxy resin, an acrylated monomer/oligomer, a photoinitiator, and an inorganic filler. These compositions are screen printed onto circuit boards.

U.S. Pat. No. 4,544,623 (Audykowski et al.) discloses photosensitive coating compositions and use thereof for protective purposes such as a solder mask on a PWB. These compositions contain organic solvents and are based on photosensitive epoxide resin carrying an ethylenically unsaturated group bound as a side chain or molecular chain as chalcone group, a customary curing agent, a cure accelerator and an organic or inorganic filler.

U.S. Pat. No. 4,902,578 (Kerr, III et al.) discloses a solvent-free uv-curable composition comprising an elastomeric polymer, bifunctional monomer, a multifunctional acrylic monomer, and a photoinitiator, the polymeric binder is acrylonitrile-butadiene which includes amino and hydroxyl groups. These compositions are used as transparent protective coatings on thermoplastic substrates such as polycarbonate sheets.

The uv-curable compositions described in the prior art are generally based on epoxide resin, epoxide/acrylic resins or epoxide/acrylated urethanes, some of which also carry organic solvents. The problem with epoxy based crosslinked thermoset materials as protective coatings on organic, inorganic, and metal surfaces is that these are high stress, high modulus and generally brittle materials which also have the problem of high moisture uptake. The presence of organic solvents in uv-curable formulations also has several problems, for example, solvent outgassing during cure, flammability, chemical safety, and health hazard when using low boiling solvents. In addition some of the solvents are classified as VOC (Volatile Organic Compounds) or HAPs (Hazardous Air Pollutants), which are subject to environmental regulations requiring strict control of volatile emissions using special emission control devices, and in some cases record keeping and regular reporting of emissions.

U.S. Pat. No. 6,682,872 discloses solvent-free, uv-curable polymer-filler composite formulations and a method of use in repairing chipped glass ceramic defects in thin film ceramic chip carriers to provide manufacturing product cost reduction by reclaiming defective modules and thereby provide yield loss recovery. The polymer-filler compositions employed for defect repair are prepared by dispersing an inorganic filler, specifically, magnesium silicate (Talc), silane modified silica, and/or organophilic nanoclay in a polymer matrix comprising a blend of reactive monomers and a low Tg low stress reactive oligomer, and a photoinitiator. Prior to repairing the chipped site at the seal band region, the ceramic substrates are precleaned by solvent rinse, for example with 2-propanol (IPA), and oven dried to remove adsorbed solvent. The uv-curable polymer-filler dispersion is then dispensed onto the chipped region to fill the defect followed by uv curing and thermal bake up to at least 270-285° C. after which the cured polymer fill is planarized when found necessary by sanding or shaving such that the polymer composite repaired region is coplanar with the adjacent ceramic topography. This method was successfully used to repair ceramic chip defects in the perimeter region of hermetic ceramic modules having multiple high circuit density thin film wiring structure with polyimide insulator.

It was found that in the application of these compositions and the defect repair process for ceramic chip repair in non-hermetic substrates having un-polished surfaces and higher porosity of ceramic, occasional adhesion loss and incidence of crazing in the repaired site polymer deposit was observed upon multiple high temperature chip join reflows with solder reflow peak temperature being 350-365° C. These differences between the polished vs. the un-polished substrates with higher porosity of ceramic may be due to trace moisture/other volatiles being trapped in the capillaries of the later type of ceramic resulting in outgassing during high temperature thermal reflows causing disruption of bond integrity at the ceramic/polyfill interphase region. Other problems such as crazing of the polyfill material in the repaired site may be process related caused by embedding of polishing media particulate in the polymer creating stress nuclei during sanding to obtain planarization of the repaired site.

Bearing in mind the problems and deficiencies of the prior art, it is an object of the present invention to provide improved uv-curable compositions for use in electronics assembly and an improved method of using these and other uv-curable compositions in electronics assembly.

SUMMARY OF THE INVENTION

The present invention provides novel uv curable polymer-filler compositions and a new method of use of the compositions and other uv-curable compositions in ceramic surface defect repair processes to provide improvement in performance reliability of electronic module assembly and to prevent product yield loss by reclaiming high density multilayer ceramic interconnect substrates by repairing non-active area chipped ceramic defects regardless of the type of ceramic.

In one aspect, this invention provides new and improved uv-curable solvent-free polymer binder-filler compositions whereby the filler component comprises an organic filler preferably polytetrafluoroethylene (Teflon PTFE powder), perfluoroethylene-perfluoro (alkoxy vinyl ether) (Teflon PFA) copolymer or PTFE and alternate fluorocarbon polymers such as fluorographite powder with varying degrees of fluorination, and a filler such as carbon black. Inorganic fillers such as Talc are typically used as the major component along with optional addition of silica, silylated silica alumina and combinations thereof, for seal band or flange area defect repair in ceramic modules. Other organic fillers that can also be used include aromatic polyamide as Aramid or Kevlar® Aramid fibers, silane pretreated Kevlar® fibers and microfibers, and poly (styrene-co-divinylbenzene) microspheres.

In another aspect of this invention, the inorganic filler such as magnesium silicate (Talc) is surface modified with, e.g., silane coupling agents and/or organotitanates and used in conjunction with PTFE powder and optionally silane coated silica as a minor component in forming dispersions with the binder system.

In yet another aspect, the invention provides an alternate improved defect repair process which eliminates in one application the problem of uv cured polyfill material delamination and incidence of crazing during high temperature chip join reflow at 350-365° C. A defect repair process according to the present invention comprises the following sequence of steps:

cleaning the substrate;
applying a primer coat of a curable polymer to the defect preferably polyimide;
drying the primer coat;
applying a UV curable repair composition to the defect;
curing the UV curable composition; and
applying a top coat of a curable polymer to the defect, preferably polyimide; and curing the top coat.

A preferred method comprises:
Solvent cleaning of the substrates, e.g., ceramic module, with a solvent such as 2-propanol (IPA) followed by drying, e.g., at 100° C. for 60 min and preferably surface activation using, e.g., $O_2$ plasma ashing;
application of a silane or other coupling agent preferably γ-aminopropyl triethoxy silane (A1100) (e.g., 0.1% A1100 solution in deionized water) on the defect site followed by bake at, e.g., 90° C./30 min, and then allow substrate to cool to about room temperature;
apply a primer coat of an optimum viscosity solution of a photosensitive polyimide on the defect site as a thin coating using, e.g., a cover slide to draw down the excess polymer, of the primer coat and soft bake at, e.g., 90-100° C./30 min:
dispense a uv-curable composition with preferably a fine tip applicator in the primed chip defect region to fill the hole and smooth the excess material using a flat edge such as a cover slide to get as planar a fill as possible;
uv exposes in preferably a uv curing oven and then subject to thermal bake up to about 285-300° C. in a $N_2$ purged oven, and allow the substrates to cool to about room temperature;
preferably subject the substrates with repaired defects to brief surface activation using an $O_2$ plasma ash to surface activate the cured polyfill material, then apply a top passivation coat using a high tensile strength and high thermal stability polyimide coating, preferably an optimum viscosity PMDA-ODA polyamic acid formulation (Pyraline 5878 DuPont Trade name) derived from condensation reaction of 1,2,4,5 tetracarboxylic dianhydride (Pyromellitic Dianhydride) and 4,4'-Oxydianiline (ODA) in n-methylpyrollidone (NMP). A thin protective coating of this polyimide is preferably obtained by dispensing a drop and sweeping the excess polyimide with a cover slip to obtain planar coverage; and
bake/cure the final polyimide passivation coat by subjecting the repaired parts to a bake/cure cycle involving heating preferably at 85° C. to 95° C. for 45 minutes; ramping to 140-150° C. and hold for 30 minutes; ramping to 220-230° C. and hold for 45 min; ramp to 300-325° C. and hold for 60 min.

It has been discovered that using the material composition and the defect repair method described according to this invention, both non-hermetic and hermetic ceramic substrates having surface defects such as chipped ceramic at the flange or seal band area can be repaired and the assembled electronic modules pass all the reliability stress exposures involving simulated high temperature reflows for flip chip joining with 97/3 Pb—Sn solder bumps, bond and assembly (BAT) processing, bubble leak test, 1 week of temperature-humidity (85° C./85%) exposure, bubble leak test, thermal cycling at 0-100° C. for 1000 cycles, and final bubble leak test.

The uv-curable composition and the method of ceramic defect repair according to this invention have the advantage of compatibility with all types of ceramic substrates including the un-polished, relatively porous ceramic, highly dense hermetic modules, or high density thin film products. Incorporation of the preferred Teflon PTFE and/or Teflon PFA powder filler as an organic filler in conjunction with an inorganic filler such as talc used in these formulations provides performance improvement in the uv-cured polymer composite material filling the ceramic chips or voids. For further modifications of the uv-curable compositions, Kevlar® fibers/microfibers can also be incorporated in small amounts (usually less than 1% in these formulations).

It is also found that application of a photosensitive polyimide layer or other curable polymer as a primer coat on the ceramic defect site prior to dispensing the uv-curable composition to fill the hole provides process improvement in terms of excellent adhesion of the uv cured polyfill composition to ceramic such that the interface integrity of the repairs is maintained at all levels of subsequent processing. Further, the uv-cured polymer filled defect site passivation by a preferred polyimide top coat has been found to provide unique advantage of a high tensile strength surface layer on the polyfill material for protection against mechanical abrasion or scratching. Potential applications of this invention include in the ceramic surface chipout defects repair for both the non-hermetic and hermetic ceramic chip carriers; UV curable solder mask for selective area protection to prevent bridging, selective imaging on ceramic or plastic substrates by standard lithographic process; low stress underfill and device passivation; and UV-curable surface passivation coat for circuit boards device protection.

It is therefore an object of the present invention to provide solvent-free, radiation-curable, particularly uv-curable, polymer-filler compositions comprising a combination of organic-and inorganic fillers to form filler-reinforced polymer composites for use in the fabrication of electronic components such as for defect repair in ceramic and thin film structures of assembled high cost high circuit density electronic modules to enhance recovery of finished product which otherwise would be discarded adding to the overall product cost and increasing the product waste.

Another object of this invention is to provide an improved method of use of these compositions and other such curable compositions in the fabrication of electronic components such as ceramic chip repair, uv-curable passivation and protective coatings on PWB circuitry and for protection of electronic devices against mechanical damage and corrosion from exposure to the environment.

Yet another object of this invention is to provide solvent-free, radiation-curable, particularly uv-curable, nanocomposite compositions, using in addition to the organic filler such as PTFE, PFA or fluorographite polymer powder as described above organically modified inorganic nano-fillers in the uv-curable organic binder system and use of these nanocomposite compositions in the fabrication of electronic components such as for ceramic surface chipout repair, protective coatings on electronic circuitry, reclamation and recovery of high circuit density ceramic modules to provide product cost reduction and waste minimization.

A further object of the present invention is to provide solvent-free, radiation-curable, particularly uv-curable, polymer-filler composite compositions using inorganic and organic fillers and polymer-nanofiller nanocomposites and use thereof in microelectronics fabrication, such as, solder mask in electronic component assembly processes; uv-curable passivation and protective coatings for device protection against mechanical damage and detrimental effects of environmental exposure, and for defect repair in assembled high circuit density electronic modules.

Still other objects and advantages of the invention will in part be obvious and will in part be apparent from the specification.

The above and other objects and advantages, which will be apparent to one of skill in the art, are achieved in the present invention which is directed to, in a first aspect, solvent-free, radiation-curable, preferably uv-curable, compositions formed by blending a polymer binder, which is a pre-formed thermoplastic or elastomeric polymer/oligomer, a monofunctional and/or bifunctional acrylic monomer, a multifunctional (more than 2 reactive groups) acrylated/methacrylated monomer, and a photoinitiator, with an organic filler such as PTFE and/or PFA, and an inorganic filler such as talc as the predominant filler, where all the constituents are mutually miscible forming a homogeneous viscous blend without the addition of an organic solvent. Such polymer binder compositions for uv-curable polymer-filler composite dispersion without the organic filler have been previously described in U.S. Pat. No. 6,682,872, supra.

These compositions may also contain other additives, for example, surfactants, coloring agents, adhesion promoters, antioxidants, and corrosion inhibitors.

In a further aspect, these compositions are applied on the desired area by standard methods of syringe dispensing, spraying, roller coating, or screen printing, and subjected to curing by exposure to uv according to conventional methods, which is followed by a thermal cure for crosslinking any residual reactive species, e.g., monomeric and/or oligomeric species.

In a further aspect of the invention, a method is provided for repairing defects in high circuit density electronic modules for product recovery and cost reduction by preventing yield loss and reduce waste.

In another aspect of the invention, the uv-curable compositions are used as a solder mask for selective coverage of PWB circuitry by adjusting the viscosity for screen printing, thus allowing selective soldering of areas which are not covered by the mask and preventing the solder bridges. After soldering processes and component attachment onto a circuit board, the uv cured solder mask can remain as a passivation/insulation coating to provide protection against detrimental effects of environmental exposure and mechanical damage.

In a further aspect of the invention, preferred uv-polymerizable compositions as described above are provided for use in product recovery and waste reduction by defect repair and reuse, micropassivation, and protective coatings on ceramic and plastic electronic modules, and for selective soldering in printed circuit board and other such uses, comprising:

an organic polymeric/oligomeric material selected from the group consisting of:

(a) poly(acrylonitrile-co-butadiene-co-acrylic acid) having reactive terminal functional groups represented by the chemical structure I;

Structure I.

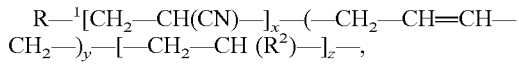

where $R^1$ and $R^2$ can be
  COO—$CH_2$—CH(OH)—$CH_2$—O—CO—C(R')=$CH_2$;
  COOH; and
  COOR";
or mixtures thereof;

where R' is H or $CH_3$ and R" is H or an organic radical represented by $C_nH_{2n+1}$, n=1 to 4;
(b) poly(acrylonitrile-co-butadiene) amine terminated, such as a bifunctional secondary amine, or a dicarboxy or a diester derived therefrom terminated oligomeric elastomer represented by chemical structure II;

Structure II:

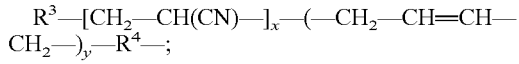

where $R^3$ and $R^4$ can be
  CONH—$CH_2$—$CH_2$—NC4H8NR';
  COOH, and
  COOR";
  or mixtures thereof;
  and R' is H or $CH_3$; and
    where R" is H or an organic radical represented by $C_nH_{2n+1}$, n=1 to 4;
(c) polybutadiene epoxy/hydroxy functionalized oligomer, represented by chemical structure III, and mixtures thereof;

Structure III:

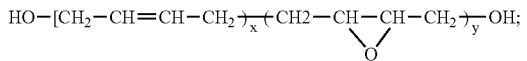

(d) acrylate polymers of the type poly(styrene-co-butyl methacrylate-co-ethyl methacrylate); poly(methyl vinyl ether); poly(ethyl acrylate-glycidyl methacrylate-methacrylic acid-methyl methacrylate), and mixtures thereof;
a monofunctional and/or bifunctional acrylic monomer such as hydroxyethyl acrylate, hydroxyethyl methacrylate and ethoxylated bis-phenol;
a polyfunctional acrylate monomer (having more than 2 functional groups) such as trimethylolpropane triacrylate (TMPTA), trimethylolpropane trimethacrylate (TMPTMA), trimethylolpropane propoxylate (PO/OH) triacrylate (TMPPTA), pentaerythritol triacrylate, pentaerythritol tetracrylate, pentaerythritol propoxylate triacrylate, and mixtures thereof; and
a photoinitiator such as the commonly used benzophenone, acetophenone, ethyl benzoin, 4,4-bis-dialkylamino benzophenone, 1-hydroxy-cyclohexyl phenyl ketone, 1,2-benzal anthraquinone, 2-ethyl anthraquinone and anthracene methanol;
an organic filler preferably PTFE; and
an inorganic filler such as talc typically used as the predominant filler component.

In another aspect of this invention, the photoinitiator can be polymer-bound or which carries an acrylate functional group bonded to the chromophoric molecule so that upon uv exposure of the formulation, it can serve its usual function of energy transfer to initiate polymerization of the reactive species in the composition and at the same time undergo crosslinking reaction with the composition constituents to become an integral part of the cured matrix. Exemplary are 4-methacryloxy-2-hydroxy benzophenone, 4-(2-acryloxy ethoxy) 2-hydroxy benzophenone, 2-(2'-methacryloxy-5'-methylphenyl) benzotriazole, which acrylate containing photoinitiators have the advantage of preventing or minimizing photoinitiator outgassing during thermal exposure.

In another aspect of the invention the above compositions are formed by utilizing in the binder an organic filler, preferably Teflon PTFE powder, typically as a minor component in combination with conventional inorganic fillers such as the commonly used magnesium silicate (Talc), mica, silica, spherical silica particles, alumina, fumed silica, silane coated silica, and mixtures thereof. The Talc filler or other filler is preferably surface modified with silane coupling agents and/or organotitanates.

In another aspect, the inorganic filler component can be a nano-filler such as the organically modified montmorillonite (mmt.) clay, alumino-silicate smectites or bentonite clay, for example, alkyl quaternary ammonium mmt. or alkyl quaternary ammonium bentonite, where the organic modification transforms the hydrophilic natural nanoclay surface to hydrophobic or organophilic surface. The nano-filler is used in combination with the PTFE and can also be used with conventional inorganic fillers such as Talc, silica, alumina and mixtures thereof. Upon uv curing, the composition comprising the compositions of the invention with organically modified nanofiller dispersion form uv-cured organic-inorganic nanocomposites with superior properties and improved performance for use in defect repair, passivation or insulation and protective coatings on ceramic and plastic electronic components.

There have been several studies on polymer-clay nanocomposites with epoxy resins, polystyrene, nylon, and polyimides which have shown toughening by nanofiller due to polymer reinforcement, increase in tensile modulus, decrease in thermal expansion, and decrease in permeability to oxygen, water vapor, and other gases. The organically modified nanoclays as plastic reinforcement additives are commercially available, for example from Southern Clay Products, Inc., Nanocor, and other sources, and can also be readily prepared by cation exchange of $Na^+$ mmt i.e. the natural montmorillonite sodium, by cation exchange of the $Na^+$ cations on the surface with a desired alkyl quaternary ammonium halide or sulfate, for example, hexadecyl trimethyl ammonium chloride or bromide, and subsequent removal of unreacted organic material by washing with alcohol, filtration, and drying to recover the hydrophobically surface modified montmorillonite clay nano-filler.

DESCRIPTION OF THE PREFERRED EMBODIMENT(S)

The present invention is generally concerned with solvent-free, radiation-curable, preferably uv-curable compositions, such that upon uv exposure, the reactive organic constituents undergo polymerization reactions resulting in formation of a cured polymer organic filler-plus inorganic filler composite or a polymer organic filler-nanofiller nanocomposite, and an improved method for using these and other curable compositions in the fabrication of microelectronic assembly products. The invention is particularly concerned with chipped ceramic defect repair with these compositions to seal imperfections or chips at the peripheral capping or seal band area in high density circuit electronic modules for yield loss recovery and thereby product cost reduction, waste minimization, and assuring protective cap seal integrity during long term device function. The invention is also concerned with the use of these uv-curable compositions as a solder mask according to standard methods of solder mask processing for selective coverage of PWB circuitry by adjusting the viscosity for stencil or screen printing, thus allowing selective soldering of areas which are not covered by the mask and preventing solder bridges. After soldering processes and component attachment onto circuit board, the uv cured polymer or polymer-filler composite layer remains as a passivation/insulation coating to provide protection against the detrimental effects of environmental exposure and mechanical damage.

The topside flange in hermetic electronic modules or the seal band region at the perimeter of non-hermetic modules for protective cap attachment is needed to seal or cap the package circuitry for protection from mechanical damage and the detrimental effects of environmental damage. In the repair of chipped ceramic defects with the uv-curable materials according to this invention, it is found that these materials meet all the bond and assembly processing requirements, for example, resistance to rosin flux; withstand high temperature chip join temperature up to 350-375° C. for less than 5 minutes; low temperature soldering process, for example eutectic lead-tin solder at about 200 to about 220° C. or lead-free solder joining of components in assembly processes at about 240 to about 280° C.; flux residue cleaning solvents and processes, for example, with xylene/isopropanol (IPA) or alternate hydrocarbon solvents; adhesion to Au, Pb/Sn solder, lead-free solder alloys such as Sn—Cu, Sn—Ag—Cu, polyimide insulator, alumina and glass ceramic and withstand thermal stress induced during reliability test exposure.

The solvent-free, uv-curable compositions according to the present invention are formed by forming an organic binder which is a pre-formed elastomeric or thermoplastic polymer/oligomer, a monofunctional and/or bifunctional acrylic monomer, a multifunctional acrylated/methacrylated monomer, and a photoinitiator, where all the constituents are mutually miscible forming a homogeneous viscous blend without the addition of an organic solvent. To the organic binder is blended an organic filler such as PTFE and an inorganic filler such as talc. For a nano-filler composite, a nano-filler is substituted or used with the inorganic filler.

The invention is further concerned with uv-curable organic-inorganic hybrid compositions wherein the inorganic filler, which can be a conventional inorganic filler and/or an organically modified nanoparticle-filler, upon uv-exposure provides a crosslinked matrix of polymer-filler composites and nanocomposites depending on the type of filler used. The uv-curing step is preferably followed by thermal curing to crosslink or polymerize any residual reactive species. For providing cured thermoset polymer deposit or coating over the electronic component for protection/passivation, the uv curable composition is applied on the desired area by standard methods of syringe dispensing, spraying, roller coating, or stencil or screen printing, and subjected to curing by exposure to uv according to conventional methods, followed by a thermal cure if necessary. The uv-curable compositions according to this invention may also contain other additives, for example, surfactants, coloring agents, adhesion promoters, antioxidants, and corrosion inhibitors.

The polymeric/oligomeric additive in the organic binder system is preferably of the type, poly(acrylonitrile-co-butadiene-co-acrylic acid) dicarboxy terminated glycidyl methacrylate (or acrylate) diester:

(Structure I, $R-^1[CH_2-CH(CN)-]_x-(-CH_2-CH=CH-CH_2-)_y-[-CH_2-CH(R^2)-]_z-$)

where $R^1$ and $R^2$ can be
$COO-CH_2-CH(OH)-CH_2-O-CO-C(R')=CH_2$;
COOH; and
COOR";
or mixtures thereof;

where R' is H or $CH_3$ and R" is H or an organic radical represented by $C_nH_{2n+1}$, n=1 to 4;

having about 18% (wt %) acrylonitrile segment with less than 1% (wt. %) residual acrylic acid groups, and having a Brookfield Viscosity about 250,000 cP and a glass transition temperature (Tg) of about −49° C.

The preferred material was purchased from Aldrich Chemical under the Product Number 418927 and is termed Poly(acrylonitrile-co-butadiene-co-acrylic acid), dicarboxy terminated, glycidyl methacrylic diester. The CAS Number is 118578-03-3 and the MDL Number is MFCD00081277. This material is manufactured by Noveon Specialty Chemicals and is among their Hycar$^R$ RLP Polymer products listing.

Other preferred materials which are also available from Aldrich Chemicals and from Noveon Specialty Chemicals (Manufacturer of Hycar$^R$ polymers) are represented by Structure II:

$R^3-[CH_2-CH(CN)-]_x-(-CH_2-CH=CH-CH_2-)_y-R^4-$;

where $R^3$ and $R^4$ can be
$CONH-CH_2-CH_2-NC4H8NR'$,
COOH, and
COOR";
or mixtures thereof;
and R' is H or $CH_3$; and
where R" is H or an organic radical represented by $C_nH_{2n+1}$, n=1 to 4;

The carboxyl group terminated oligomer (Aldrich Product Number 418889) where $R^3$ and $R^4$ are COOH. The CAS Number is 68891-50-9 and MDL Number MFCD00081277. The number average molecular weight (Mn) is 3600, contains 18 wt. % acrylonitrile and 2.4 carboxyl groups. The viscosity is 160,000 cP @ 27° C. (Brookfield) and the glass transition temperature (Tg) is −52° C.

Another poly(acrylonitrile-co-butadiene) amine terminated bifunctional secondary amine oligomeric elastomer, Structure II comprises
$R^3$ and $R^4$=$-CONH-CH_2-CH_2-NC4H8NR'$, where R'=H) having 18% (wt %) acrylonitrile segment in the copolymer and viscosity about 200,000 cP @ 27° C. (Brookfield), a Tg of −51° C. and an Amine E. W. of 900. The Aldrich Product Number is 418900, the CAS Number is 68683-29-4 and the MDL Number MFCD00133994.

Another reactive polymer/oligomer additive that can also be used in the uv curable compositions include a polybutadiene epoxy/hydroxy functionalized polymer (Structure III).

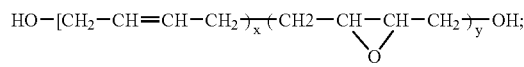

Alternate polymer additives which can be used may require solvent to solubilize are the acrylate polymer binders of the type poly(styrene-co-butyl methacrylate-co-ethyl methacrylate); poly(methyl vinyl ether); poly(ethylacrylate-glycidyl methacrylate-methacrylic acid-methyl methacrylate); poly(styrene-co-isobornyl acrylate-co-glycidyl methacrylate), and related copolymer and terpolymer systems.

Various monofunctional and bifunctional acrylic monomers that can be used for the purpose of this invention include: hydroxyethyl acrylate, hydroxyethyl methacrylate, ethoxylated bis-phenol A diacrylate, hexanediol diacrylate, 2-ethylhexyl acrylate, methyl methacrylate, cyclohexyl acrylate, butyl methacrylate, 2-phenoxy ethyl acrylate, 2-phenoxy ethyl methacrylate, 2,2-bis(4-ethacryloxyphenyl) propane, 2,2-bis(4-methacryloxyphenyl)propane, 2,2-bis[4-(2-acryloxyethoxy)phenyl propane, isobornyl acrylate, isobornyl methacrylate, styrene monomer, acetoxy styrene monomer, and related acrylic monomers, and acrylic-epoxy monomers such as glycidyl acrylate, glycidyl methacrylate, allyl glycidyl ether, and related reactive monomers which are well known in the art and are commercially available, and mixtures thereof.

Polyfunctional acrylate monomers (having more than 2 functional groups) preferred according to this invention are: trimethylolpropane triacrylate (TMPTA), trimethylolpropane trimethacrylate (TMPTMA), propoxylated trimethylolpropane triacrylate (PO/OH) (TMPPTA), pentaerythritol tetracrylate, pentaerythritol triacrylate and mixtures thereof, which are well known in the art.

Preferred photoinitiators for the solvent-less uv-curable compositions described herein are the commonly used photoinitiators, for example, benzophenone, acetophenone, ethyl benzoin, 4,4-bis-dialkylamino benzophenone, 1-hydroxy-cyclohexyl phenyl ketone, 1,2-benzal anthraquinone, 2-ethyl anthraquinone, anthracene methanol. In another aspect of this invention, the photoinitiator can be polymer-bound and/or which carry acrylate or other functional group bonded to the chromophoric molecule so that upon uv exposure of the formulation, it can serve its usual function of energy transfer to initiate acrylate polymerization of the reactive species in the composition and at the same time undergo crosslinking reaction with the composition polymer matrix to become an integral part of the cured matrix, for example, 4-methacryloxy-2-hydroxy benzophenone, 4-(2-acryloxy ethoxy) 2-hydroxy benzophenone, 2-(2'-methacryloxy-5'-methylphenyl) benzotriazole, which has the advantage of preventing photoinitiator outgassing during thermal exposure, and more preferably photoinitiators which have covalently bonded acrylate side chain and chromophore moiety, for example, allylic or vinyl functional group carrying chromophoric compounds represented by 4-methacryloxy-2-hydroxy benzophenone, 4-(2-acryloxy ethoxy) 2-hydroxy benzophenone 4-vinyl anthracene, 2-(2'-methacryloxy-5'-methylphenyl) benzotriazole, such that upon uv exposure of the coating on substrate using I-line, deep uv, or broad band uv irradiation lamp source, its chromophoric segment serves its usual function of uv absorption and energy transfer to the reactive species of the composition to initiate polymerization and at the same time it itself can undergo crosslinking reaction with the composition constituents to become an integral part of the cured matrix. A polymer-bound photoinitiator can also be used with the advantage of preventing photoinitiator outgassing during post-uv exposure thermal treatment.

The above components form the organic binder system used to make the compositions of the invention which compositions further include an organic filler such as fluorocarbon polymer powder, preferably Teflon PTFE and/or Teflon PFA and an inorganic filler such as talc.

In forming polymer-filler composite formulations of the invention, the organic filler component according to this invention comprises an organic filler, preferably PTFE powder. Other organic fillers include alternate fluorocarbon polymers, fluorographite polymer powder at varying degrees of fluorination, carbon black or combinations thereof, and aromatic polyamide or Aramid/Kevlar fibers, and poly (styrene-co-divinylbenzene) microspheres. The PTFE powder is typically present as a minor component and in combination with the conventional type inorganic fillers, preferably magnesium silicate (Talc), mica, silica, alumina, aluminum silicate, fumed silica, silane modified silica, spherical silica particles and mixtures thereof wherein the Talc filler is preferably used as the major part of the filler. The inorganic filler can also preferably be surface modified with silane coupling agents and/or organotitanates.

The PTFE organic filler can be added in the range from about 0.01%, e.g., 0.5%, to about 2% to about 10% or more, preferably in the range 0.5-5%. The particle size of the PTFE is typically about 2 to 40 micron, preferably 3 to 15 micon. Talc or other such filler as the major inorganic filler in the range from about 0.5% to about 40% or more (by weight of the total composition), preferably in the range 5-30%. The talc preferably has an average particle size preferably less than 10 um, more preferably less than 5 um. Other inorganic fillers as silane coated silica and/or alumina can be added in the same range but preferably in small amounts in the range about 1% to about 5% (wt. %).

In forming nanocomposites, nanoclay, for example, the organically modified Montmorillonite (mmt.) Clay, alumino-silicate smectites or bentonite clay, for example, alkyl quaternary ammonium mmt. or alkyl quaternary ammonium bentonite, where the organic modification transforms the hydrophilic natural nanoclay surface to hydrophobic or organophilic surface, can be blended in the range of about 1% to about 15% or more, preferably in the range of about 3% to about 10% (by weight of the total composition). The nanoclay filler can be used in combination with PTFE and the conventional inorganic fillers such as Talc and silica.

Upon uv curing, the composition comprising the organic binder-organically modified nanofiller dispersion forms uv-cured organic-inorganic nanocomposites with superior properties and improved performance for use in defect repair, passivation or insulation and protective coatings on ceramic and plastic electronic components. The organically modified nanoclays as plastic reinforcement additives are commercially available, for example from Southern Clay Products, Inc., Nanocor, and other sources, and can also be readily prepared by cation exchange of $Na^+$ mmt i.e. the natural montmorillonite sodium, by cation exchange of the $Na^+$ cations on the surface with a desired alkyl quaternary ammonium halide or sulfate, for example, hexadecyl trimethyl ammonium chloride exchange of $Na^+$ cation with hexadecyl trimethylammonium cation $[CH_3—(CH_2)_{15}]$ $N^+$ $(CH_3)_3$, using hexadecyl trimethylammonium bromide, and subsequent removal of unreacted organic material with alcohol, filtration, and drying to recover the hydrophobically surface modified montmorillonite clay nano-filler. Organically modified nanoclay layered silicates that are commercially available generally are of the type $R_1R_2R_3R_4N^+$. mmt, where at least one of the $R_1$, $R_2$, $R_3$, or $R_4$ groups represent a long chain hydrophobic moiety such as C18 or tallow exchanged mmt.

The viscosity of the curable compositions of the invention can be adjusted by modifying the relative ratio of the reactants to the desired application method such as hand dispensing or using autodispense tool, roller coating, stencil or screen printing. It has been found that the uv-curable compositions of this invention undergo rapid polymerization upon exposure to uv radiation to give essentially transparent nanocomposite cured product or with a filler such as talc, a somewhat opaque composite cured product is formed. The cured product in each type composition shows excellent adhesion to ceramic, polyimide insulator, Au, Pb/Sn solder, Sn—Ag—Cu, Mo—Ni—Au, and is capable of withstanding Bond and Assembly processing including prolonged contact with rosin flux, a few minutes of high temperature exposure, for example, higher than 300° C., during chip join conditions, flux residue cleaning using xylene/IPA, with no visible change such as degradation, cracking or delamination, and reliability stress exposures involving 85°/85% temperature-humidity and 0-100° C. thermal cycling.

Other formulation additives that can be used in conjunction with constituents described above include:

an adhesion promoter, e.g., organosilanes, for example, gamma-aminopropyl triethoxysilane, organotitanates, polymerizable group carrying silanes such as epoxy and vinyl functionalized alkoxysilanes, for example, vinyl trialkoxysilane, vinyl triacetoxysilane, glycidoxypropyl triethoxysilane, gamma-methacryloxypropyl trimethoxysilane;

a coloring agent or a dye for providing contrast of the uv-curable composition on a substrate, the dye is selected such that it forms a miscible blend or dispersion with the formulation, is thermally stable and maintains contrast during uv-curing and any subsequent thermal processing either by retaining original color or undergoing color change due to thermal transformation at high temperature if that occurs;

a surfactant or surface-active agent to provide formulation stability with no phase separation during storage, and to provide optimum wetting of the surface on which the composition is applied.

Various constituents of the solvent-free uv-curable organic-inorganic composite compositions according to this invention are typically formulated with the following relative % (weight %):

preformed polymeric/oligomeric additive, 20-50%, preferably 25 to 45%;
acrylate monomer (mono-functional, bifunctional or a combination), 10-25%, preferably 10 to 20%;
multifunctional acrylate monomer/oligomer, 10-25%, preferably 10 to 20%;
uv polymerization initiator, 0.3-5%, preferably 1 to 2.5%;
organic filler, PTFE 0.01%-10%, preferably 0.5 to 5%;
optional silane coated silica, preferably 1-5%;
inorganic filler, e.g., talc, 20-40%, preferably 15 to 30%; and
optional organically modified nanofiller, 1-15%, preferably 3 to 10%.

For polymer nanocomposites formulated using a combination of nanofiller and the conventional inorganic particle filler such as Talc, following relative wt % of various ingredients is representative:

preformed polymeric/oligomeric additive, 20-50%, preferably 25 to 45%;
acrylate monomer (mono-functional, bifunctional or a combination), 10-25%, preferably 10 to 20%;
multifunctional acrylate monomer/oligomer, 10-25%, preferably 10 to 20%;
uv polymerization initiator, 0.5-5%, preferably 1 to 2.5%;
organic filler, PTFE 0.5-10%, preferably 0.5 to 5%;
optional silane coated silica, preferably 0.5 to 5%;
inorganic filler, e.g., talc 10-25%, preferably 10 to 20%;
organically modified nanofiller, e.g., mmt.nanoclay, 1-15%, preferably 3 to 10%.

For polymer nanocomposites formulated using nanofiller such as organically modified nanoclay, following relative wt % of various ingredients is representative:

preformed polymeric/oligomeric additive, 30-60%, preferably 30 to 55%;
acrylate monomer (mono-functional, bifunctional or a combination), 10-25%, preferably 10 to 20%;
multifunctional acrylate monomer/oligomer, 10-25%, preferably 10 to 20%;
uv polymerization initiator, 0.5-5%, preferably 1 to 3%;
organic filler, PTFE 0.1-5%, preferably 0.5 to 2%;
optional silane coated silica, preferably 0.5 to 2%;
organically modified nanofiller mmt. nanoclay, 1-10%, preferably 4 to 10%

Other additives such as a surface active agent, adhesion promoter, viscosity modifier are added if desired along with a coloring agent to provide contrast, for example, trace amount of Orasol Blue N, Oil Red ELN or Oil Red O, or Nigronine dye can be incorporated.

REPRESENTATIVE EXAMPLES

UV curable compositions were prepared using the following procedure. Unless otherwise specified, all the organic and inorganic materials used in these compositions were obtained from commercial sources and used as-received.

Example 1

Preparation of Stock UV Curable Binder Composition

Poly(acrylonitrile-co-butadiene-co-acrylic acid) dicarboxy terminated glycidyl methacrylate diester (Structure I, where $R^1$ and $R^2$ are —COO—$CH_2$—CH(OH)—$CH_2$—O—CO—C(R')=$CH_2$), and R'=$CH_3$), 12.2 g, was blended into a mixture of 2.2 g trimethylolpropane propoxylated (PO/OH 1) triacrylate (TMPPTA), 2.7 g of TMPTA and 3.0 g. hydroxyethyl acrylate (2-HEA), and 2.4 g hydroxyethyl methacrylate (2-HEMA), and 0.8 g glycidyl methacrylate (GMA) by slow addition with stirring till a homogeneous viscous blend was formed. To the clear homogeneous mixture was added 0.4 g of benzophenone (99% purity) as a photoinitiator which was thoroughly mixed till all solids dissolved to obtain a uv curable composition referred to as Stock Binder solution. All the materials used in this composition were obtained from Aldrich Chemical Co.

Preparation of a UV Curable Polymer-Filler Composite Composition

To 10 g of the Stock Binder solution described above was dispersed Talc pigment (Nytal-400, avg. particle size 4.6 um, R.T. Vanderbit Co., Inc.) predried by heating at 200° C. for 2-3 hours in a $N_2$ purged oven, 3.4 g by adding in portions with slow mixing after each addition till a homogeneous dispersion was formed. To this dispersion was added 0.17 g of polytetrafluoroethylene powder (PTFE) and about 0.15 g silane coated silica followed by thorough mixing to blend in additional fillers and obtain the composite formulation of desired viscosity.

Preparation of a UV Curable Polymer-filler/nanofiller Nanocomposite Composition

To 10.0 g of the Stock Binder solution described above in Example 1 was added 0.50 g of the organically modified-mmt., Cloisite 25A (Southern Clay Products), and 1.5 g of Talc (Nytal-7700, average particle size 1.7 um) in portions with slow mixing after each addition until a homogeneous dispersion was formed. To this dispersion was added 0.12 g of polytetrafluoroethylene powder (PTFE) and about 0.1 g silane coated silica followed by thorough mixing to blend in additional fillers and obtain the composite formulation of desired viscosity.

To provide color contrast in application of these compositions for the purposes according to this invention, trace amount of a coloring agent such as a dye, for example, Oil Blue N, also referred to as Solvent Blue 14, was added to the compositions described above. Alternatively, a red dye such as Oil Red EGN or Oil Red O can also be used. The uv-curable compositions of Example 1 were tested for compatibility with the processing conditions typically used in microelectronics bond and assembly operations as given in the following:

Each of the uv-curable compositions of Example 1 was dispensed onto glass slides and was subjected to uv exposure for 1-2 minutes with the exposure carried out using as the radiation source an Argus 7312 Series UV Processor with UV Source 350 WPI having a medium pressure Hg Arc Lamp (sold by Argus International), followed by optional post exposure bake up to 250° C. to provide a hard scratch resistant coating having good adhesion to the substrate. The cured coatings were tested for resistance to solvent permeation with high temperature Rosin flux such as alpha-102-1500 flux in benzyl alcohol and xylene by placing the flux solution over the uv cured material for about 15 to about 60 minutes, then placing the Pb/Sn solder balls over the flux and rapid temperature ramping up to solder melt temperature, followed by cooling to room temperature and subjecting to flux cleaning process using xylene and IPA. Visual and microscopic inspection showed no change in the uv cured material and showed no problem of dissolution, cracking/crazing or delamination. With the compositions where Oil Blue dye had been added, it was noticed that color changed to yellow after the uv-curing step and it essentially remained unchanged during the subsequent process exposures.

Method of repairing electronic assembly product defects with the uv-curable compositions described in Example 1:

High circuit density ceramic electronic modules that had defects in the ceramic flange area or the seal band area on top side such as chipped ceramic, and depressions, are repaired by the following method using the compositions of Example 1: A representative defect repair process according to the present invention involves the following sequence of steps:

solvent cleaning of ceramic substrates with 2-propanol (IPA) followed by drying at 100° C. for 60 min and $O_2$ plasma ashing for surface activation;

application of silane coupling agent (0.1% A1100 in deionized water) on the defect site followed by bake at 90° C./30 min, allow substrates to cool to room temperature;

apply a primer coat of an optimum viscosity solution of a photosensitive polyimide on the defect site as a thin coating using a cover slide to draw down the excess polyimide, and the primer coat and soft bake at 90-100° C./30 min. A representative photosensitive polyimide used as a primer coat is PSPI-7510 (or Duramide 7510, purchased from Arch Chemicals, later). The as-received formulation is preferably diluted at least 1:1.5 with NMP to obtain low viscosity solution found suitable for a thin primer coat;

dispense the uv-curable composition with a fine tip applicator in the primed chip defect region to fill the hole and smooth the excess material using a cover slide to get as planar a fill surface as possible;

uv expose in a uv curing oven and then subject to thermal bake up to 285-300° C. in a $N_2$ purged oven, allow the substrates to cool to room temperature;

subject the substrates with repaired defects to brief $O_2$ plasma ash to surface activate the cured polyfill material, then apply a top passivation coat using a high tensile strength and high thermal stability polyimide coating using an optimum viscosity PMDA-ODA polyamic acid formulation (Pyraline 5878 DuPont Trade name) derived from condensation reaction of 1,2,4,5 tetracarboxylic dianhydride (Pyromellitic Dianhydride) and 4,4'-Oxydianiline (ODA) in n-methylpyrollidone (NMP); a thin protective coating of this polyimide is obtained by dispensing a drop and sweeping the excess polyimide with a cover slip to obtain planar coverage;

bake/cure the final polyimide passivation coat by subjecting the repaired parts to a bake/cure cycle involving heating at 85° C. to 95° C. for 45 minutes; ramping to 140-150° C. and hold for 30 minutes; ramping to 220-230° C. and hold for 45 min; ramp to 300-325° C. and hold for 60 min.

The substrates with repaired ceramic chip defects at the flange or seal band area are found to pass all the reliability stress exposures involving simulated high temperature reflows for flip chip joining with 97/3 Pb-Sn solder bumps, bond and assembly (BAT) processing, bubble leak test, 1 week of temperature-humidity (85° C./85%) exposure, bubble leak test, thermal cycling at 0-100° C. for 1000 cycles, and final bubble leak test.

Example 2

Preparation of Another Stock Binder UV-Curable Composition

Poly(acrylonitrile-co-butadiene-co-acrylic acid) dicarboxy terminated glycidyl methacrylate diester (Structure I, where $R^1$ and $R^2$=—COO—$CH_2$—CH(OH)—$CH_2$—O—CO—C(R')=$CH_2$), $R^1$=$CH_3$), 10.2 g, was blended into a mixture of 1.9 g trimethylolpropane triacrylate (TMPTA), 1.5 g of trimethylolpropane propoxylate (PO/OH) triacrylate (TMPPTA), 2.1 g of 2-hydroxyethyl acrylate (HEA), 0.8 g of 2-hdroxyethyl methacrylate (HEMA), and 0.5 g glycidyl methacrylate by slow addition with stirring till a homogeneous viscous blend was formed. This was followed by the addition and mixing of benzophenone, 0.5 g as a uv polymerization initiator and 0.04 g of glycidoxypropyl trimethoxysilane as an adhesion promoter to obtain a uv curable composition (Stock solution). All the materials used in this composition were obtained from Aldrich Chemical Co.

Preparation of a Polymer-Filler Composite from the UV-Curable Composition of Example 2

To 10.0 g of the Stock solution of Example 2 described above was added 3.5 g of a Talc pigment (Nytal-400, purchased from R. T. Vanderbit Co., Inc.) in portions with slow mixing after each addition till a homogeneous dispersion was formed. To this dispersion was added 0.15 g PTFE powder followed by thorough mixing till a uniform dispersion was formed.

Similarly, a uv-curable polymer-nanofiller nanocomposite formulation was prepared by blending 0.85 g of the organically modified-mmt., Cloisite 25A (Southern Clay Products), into 9.5 g of the uv-curable composition of Example 2 by slow addition and mixing of the filler after each addition resulting in a homogeneous essentially transparent dispersion. These formulations were tested as described above in Example 1, for compatibility with the various bond and assembly processes commonly used in microelectronics fabrication and found to meet all the processing and performance requirements.

Example 3

Preparation of Another Stock Binder UV-Curable Composition

Poly(acrylonitrile-co-butadiene) amine terminated difunctional amine oligomer, 10 wt % acrylonitrile (Structure II, where R=—CONH—CH2—CH2—NC4H8NR', where R'=H), 2.5 g was blended into a mixture of 0.2 g glycidyl methacrylate, 0.6 g trimethylolpropane triacrylate (TMPTA), 0.2 g trimethylolpropane propoxylate (PO/OH) triacrylate (TMPPTA), 0.3 g 2-hydroxyethyl acrylate (HEA), 0.2 g of 2-hdroxyethyl methacrylate (HEMA), and 0.35 g ethyleneglycol methyl ether methacrylate by slow addition with stirring till a homogeneous viscous blend was formed after which 0.025 g of benzoin as a uv polymerization initiator was mixed in to form a uv-curable composition (Stock solution).

Preparation of a Polymer-Filler Composite From the UV-Curable Composition of Example 3

A uv-curable polymer-filler composition using the above stock solution was prepared by blending in 0.45 g of Nytal-7700 Talc pigment (Vanderbit Co., Inc.) and 0.08 g PTFE powder into 2.1 g of the above described composition by adding the filler in portions and thoroughly mixing after each addition till a homogeneous dispersion was formed. Another polymer-filler dispersion using the composition of Example 3 was prepared by blending silane surface modified Talc as a major component in conjunction with silane surface modified silica.

Similarly, uv-curable nanocomposites were prepared using the stock composition of Example 3 and organically modified nanoparticle filler and PTFE and forming dispersion according to the method described in Example 1. For providing color contrast, a coloring agent such as the dye described in Example 1 was added to the original stock composition and the polymer-filler composite formulations derived therefrom.

These formulations were tested as described above in Example 1, for compatibility with the various bond and assembly processes commonly used in microelectronics fabrication and found to meet all the processing and performance requirements.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

What is claimed is:

1. A solvent-free, uv-curable organic binder-filler composition comprising a preformed thermoplastic or elastomeric polymer/oligomer with reactive end groups, a monofunctional and/or bifunctional acrylate or methacrylate monomer selected from the group consisting of hydroxyethyl acrylate, hydroxyethyl methacrylate, ethoxylated bis-phenol A diacrylate, hexanediol diacrylate, 2-ethylhexyl acrylate, methyl methacrylate, cyclohexyl acrylate, butyl methacrylate, 2-phenoxy ethyl acrylate, 2-phenoxy ethyl methacrylate, 2,2-bis(4-ethacryloxyphenyl)propane, 2,2-bis(4-methacryloxyphenyl)propane, 2,2-bis[4-(2-acryloxyethoxy)phenyl propane, isobornyl acrylate, isoborny methacrylate, glycidyl acrylate, glycidyl methacrylate, and mixtures thereof, a multifunctional acrylated/methacrylated monomer having more than two functional groups selected from the group consisting of trimethylolpropane triacrylate (TMPTA), trimethylolpropane trimethacrylate (TMPTMA), trimethylolpropane propoxylate (PO/OH) triacrylate (TMPPTA), pentaerythritol triacrylate, pentaerythritol tetracrylate, pentaerythritol propoxylate triacrylate, and mixtures thereof, a photoinitiator, and having dispersed therein an organic filler and an inorganic filler where all the constituents are blended forming a homogeneous dispersion without the addition of an organic solvent.

2. The composition of claim 1 wherein the organic filler is selected from the group consisting of polytetrafluoroethylene, perfluoroethylene-perfluoro (alkoxy vinyl ether) and mixtures thereof.

3. The composition of claim 1 wherein the organic filler is fluorographite powder, carbon black or combinations thereof.

4. The composition of claim 1 wherein the organic filler is an aromatic polyamide.

5. The composition of claim 1 wherein the organic filler is polytetrafluoroethylene and the inorganic filler is magnesium silicate.

6. The composition of claim 1 wherein the inorganic filler is magnesium silicate.

7. The composition of claim 1 wherein the polymer/oligomer is:

poly(acrylonitrile-co-butadiene-co-acrylic acid) having reactive terminal functional groups represented by the chemical structure I;

Structure I.

$R-^1[CH_2-CH(CN)-]_x-(-CH_2-CH-CH-CH_2-)_y-[-CH_2-CH(R^2)-]_z-$, where $R^1$ and $R^2$ can be

COO—$CH_2$—CH(OH)—$CH_2$—O—CO—C(R')—$CH_2$;

COOH; and

COOR";

or mixtures thereof;

where R' is H or $CH_3$ and R" is H or an organic radical represented by $C_nH_{2n+1}$, n=1 to 4.

8. The composition of claim 1 wherein the polymer/oligomer is:

poly(acrylonitrile-co-butadiene) amine terminated oligomeric elastomer represented by chemical structure II;

Structure II:

$R^3-[CH_2-CH(CN)-]_x-(-CH_2-CH-CH-CH_2-)_y-R^4-$;

where $R^3$ and $R^4$ can be

CONH—$CH_2$—$CH_2$—NC4H8NR',

COOH, and

COOR";

or mixtures thereof;

and R' is H or $CH_3$; and where R" is H or an organic radical represented by $C_nH_{2n+1}$, n=1 to 4.

9. The composition of claim 1 wherein the polymer/oligomer is:

polybutadiene epoxy/hydroxy functionalized oligomer, represented by chemical structure Ill, and mixtures thereof;

Structure Ill:

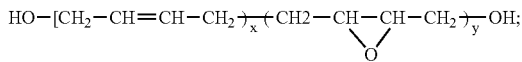

10. The composition of claim 1 wherein the polymer/oligomer is:
    selected from the group consisting of poly(styrene-co-butyl methacrylate-co-ethyl methacrylate); poly(methyl vinyl ether); poly(ethyl acrylate-glycidyl methacrylate-methacrylic acid-methyl methacrylate), and mixtures thereof.

11. The composition of claim 1 wherein the photoinitiator is selected from the group consisting of benzophenone, acetophenone, ethyl benzoin, 4,4-bis-dialkylamino benzophenone, 1-hydroxy-cyclohexyl phenyl ketone, 1,2-benzal anthraquinone, 2-ethyl anthraquinone, anthracene methanol, and mixtures thereof.

12. The composition of claim 1 wherein the inorganic filler is a nano-filler.

13. The composition of claim 12 wherein the nano-filler is organically modified clay.

14. The composition of claim 1 wherein the inorganic filler is a combination of an inorganic filler and a nano-filler.

15. The composition of claim 14 wherein the organic filler is polytetrafluoro ethylene and the inorganic filler is magnesium silicate and organically modified clay.

16. A method of repairing defects on ceramic substrates comprising:
    cleaning the substrate;
    applying a primer coat of a curable polymer to the defect;
    drying the primer coat;
    applying a uv curable organic binder-filler repair composition according to claim 1 to the defect;
    curing the uv curable composition;
    applying a top coat of a curable polymer to the defect; and
    curing the top coat.

17. A method of repairing defects on ceramic substrates comprising:
    oxygen plasma treating the substrate;
    applying a silane coupling agent to the substrate;
    applying a primer coat of a photosensitive polyimide on the substrate at the defect;
    drying or soft baking the primer coat;
    applying a UV-curable organic binder-filler repair composition according to claim 1 on the defect;
    exposing the repair composition to UV radiation;
    subjecting the UV exposed repair composition to thermal bake;
    surface activating the repaired defect;
    applying a passivation coating of a polyimide on the repaired defect; and
    curing the polyimide.

* * * * *